United States Patent [19]
Kajihara et al.

[11] Patent Number: 5,977,846
[45] Date of Patent: Nov. 2, 1999

[54] UNIDIRECTIONAL SURFACE ACOUSTIC WAVE FILTER

[75] Inventors: Ryuji Kajihara; Yasushi Yamamoto, both of Tokyo, Japan

[73] Assignee: NEC Corporation, Tokyo, Japan

[21] Appl. No.: 08/960,501

[22] Filed: Oct. 29, 1997

[30] Foreign Application Priority Data

Oct. 30, 1996 [JP] Japan ..................................... 8-288000

[51] Int. Cl.⁶ .................................................. H03H 9/64
[52] U.S. Cl. .................. 333/196; 310/313 B; 310/313 C
[58] Field of Search .................................... 333/193–196; 310/313 R, 313 B, 313 C, 313 D

[56] References Cited

U.S. PATENT DOCUMENTS

| | | | |
|---|---|---|---|
| 4,642,506 | 2/1987 | Lewis | 310/313 D |
| 4,736,172 | 4/1988 | Ebneter | 333/193 |
| 5,294,859 | 3/1994 | Yamanouchi et al. | 333/193 X |
| 5,306,978 | 4/1994 | Yamanouchi et al. | 310/313 B X |
| 5,438,306 | 8/1995 | Yamanouchi et al. | 333/194 X |
| 5,550,793 | 8/1996 | Dufilie | 333/193 X |
| 5,663,695 | 9/1997 | Tanaka et al. | 333/193 |
| 5,703,427 | 12/1997 | Solal et al. | 333/195 X |

FOREIGN PATENT DOCUMENTS

| | | | |
|---|---|---|---|
| 0564881 A1 | 10/1993 | European Pat. Off. | 333/193 |
| 8-162896 | 6/1996 | Japan | 333/196 |

OTHER PUBLICATIONS

K. Yamanouchi et al. "New Low–Loss Saw Filter Using Internal Floating Electrode Reflection Types of Single–Phase Unidirectional Transducer", Electronics Letters, vol. 20 No. 24, Nov. 22, 1984 pp. 989–990.

T. Kodama et al., "Design of Low–Loss Saw Filters Employeing Distributed Acoustic Reflection Transducers", IEEE 1986 Ultrasonics Symposium, pp. 59–64.

Primary Examiner—Robert Pascal
Assistant Examiner—Barbara Summons
Attorney, Agent, or Firm—Whitham, Curtis & Whitham

[57] ABSTRACT

The inside-band characteristic of an internal reflection type unidirectional surface acoustic wave filter is improved by using an internal reflection type unidirectional surface acoustic wave filter having positive and negative finger electrodes (10, 11) of the interdigital transducer and having open or short-circuit type floating electrodes (12) therebetween. The finger electrodes are subjected to weighting by a withdrawal technique and the filter is structured such that at portions wherein no electrical cross is made between the positive and negative finger electrodes, i.e., in case where adjacent finger electrodes each have the same sign as that of the positive finger electrode or negative finger electrode, the floating electrodes (13) located therebetween are not displaced from the center positions therebetween.

12 Claims, 6 Drawing Sheets

FREQUENCY
(CENTER FREQUENCY 201MHz)

UNIDIRECTIONAL SURFACE ACOUSTIC WAVE FILTER

BACKGROUND OF THE INVENTION

The present invention relates to a surface acoustic wave filter, and more particularly to an internal reflection type unidirectional surface acoustic wave filter having floating electrodes.

As means for converting a transversal surface acoustic wave filter to a low-loss version, there has hitherto been proposed a unidirectional surface acoustic wave filter. Japanese Patent Publication (b2) No. 20929 of 1991 shows that unidirectivity can be obtained by inserting an open or short-circuit type floating electrode between positive and negative finger electrodes of an interdigital transducer (IDT) and displacing the position of this floating electrode from a center position between the positive and negative finger electrodes.

Figure 1:
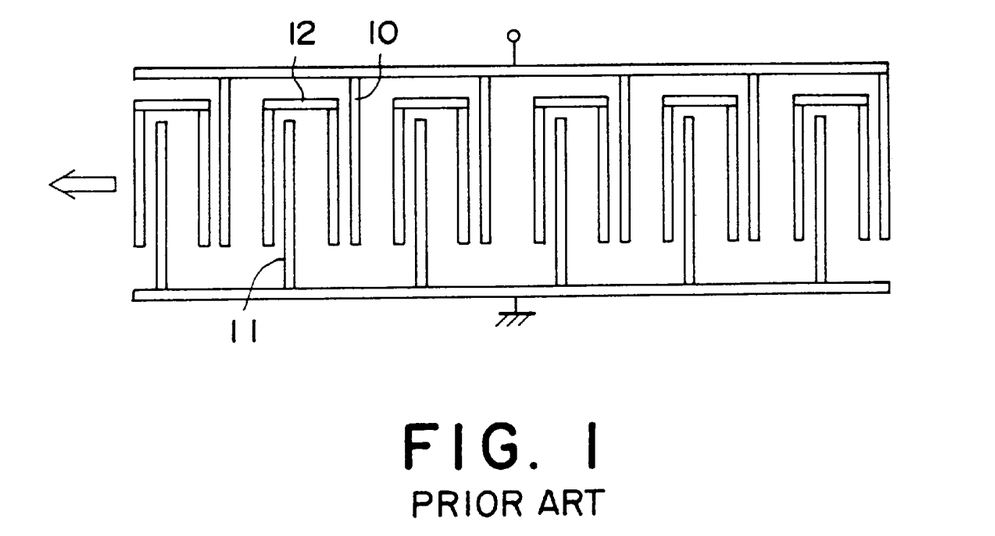
FIG. 1 is a plan view illustrating a first example of a conventional unidirectional surface acoustic wave filter.

For example, as illustrated in FIG. 1, when a short-circuit type floating electrode 12 is disposed between positive and negative finger electrodes 10 and 11 of the interdigital transducer in such a way as to be displaced from a center position therebetween, a surface acoustic wave is strongly excited in an arrow-indicated direction in FIG. 1, with the result that unidirectivity occurs.

Figure 2:
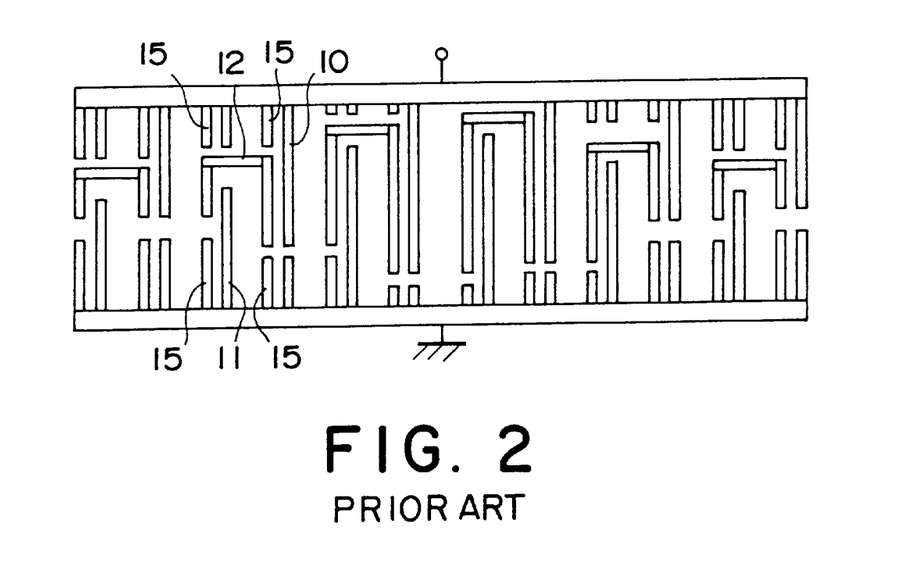
FIG. 2 is a plan view illustrating a second example of a conventional unidirectional surface acoustic wave filter.
Figure 3:
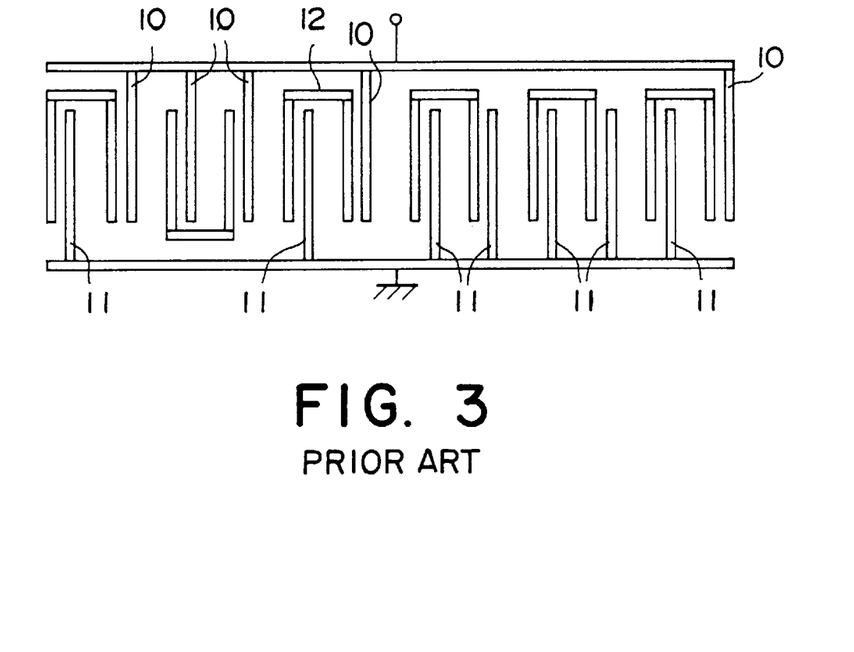
FIG. 3 is a plan view illustrating a third example of a conventional unidirectional surface acoustic wave filter.

In this conventional internal reflection type unidirectional surface acoustic wave filter having open or short-circuit type floating electrodes, when using electrodes weighted by an apodization or withdrawal weighted electrodes in order to suppress the outside-band sidelobe levels, a structure of finger electrodes that includes the short-circuit type floating electrodes is as illustrated in FIGS. 2 and 3.

In a unidirectional surface acoustic wave filter with an IDT finger electrode width of $\lambda/12$ ($\lambda$: wavelength) and short-circuit type floating electrodes 12, such as that illustrated in FIG. 3, when using the withdrawal weighted electrodes, the following phenomenon occurs at portions where the positive and negative finger electrodes 10 and 11 do not cross each other, i.e., in case where adjacent finger electrodes are the same positive finger electrode 10 or negative finger electrode 11. That is, although these finger electrodes 10, 11 or floating electrodes 12 have no relevancy to the excitation of surface acoustic waves, they disturb the phase thereof by acoustic reflection thereof, with the result that the inside-passband characteristic exhibits ripples as illustrated in FIG. 4.

Figure 4:
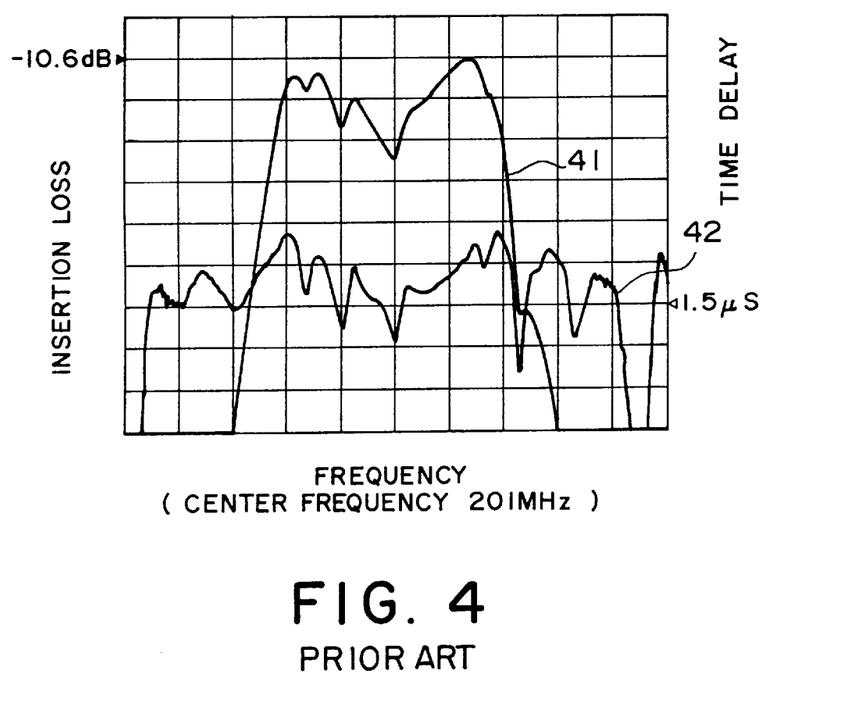
FIG. 4 is a graph illustrating an amplitude characteristic and group delay characteristic obtained by the third example of the conventional unidirectional surface acoustic wave filter.

FIG. 4 illustrates an amplitude characteristic 41 and a group delay characteristic 42 obtained from a filter prepared by disposing the electrode structure of FIG. 3 with respect to each of input and output transducers on a quartz substrate. In this graphic diagram, the center frequency is 201 MHz (megahertz'), the thickness of the aluminium electrode is 200 nm (nanometers) and the impedance is 90 ohms at the input side and 150 ohms at the output side. The axis of abscissas represents the frequency and is graduated in 100 kHz (kilohertz') per graduation. The axis of ordinates represents the insertion loss of the amplitude characteristic and the time delay of the group delay characteristic and is graduated in 1 dB (decibel) and 1 $\mu$s (microsecond), respectively, per graduation.

In the conventional internal reflection type unidirectional surface acoustic wave filter, there is the problem that when using the withdrawal or apodization weighted electrodes, ripples occur inside the passband and so the filtering characteristic deteriorates.

The unidirectional surface acoustic wave filter is theoretically discussed in a paper contributed by K. Yamanouchi and another to the ELECTRONICS LETTERS, Vol. 20, No. 24 (Nov. 22, 1984), pages 989 to 990, under the title of "NEW LOW-LOSS SAW FILTER USING INTERNAL FLOATING ELECTRODE REFLECTION TYPES OF SINGLE-PHASE UNIDIRECTIONAL TRANSDUCER" and a paper contributed by T. Kodama and three others to the IEEE 1986 ULTRASONICS SYMPOSIUM, pages 59 to 64, under the title of "DESIGN OF LOW-LOSS SAW FILTERS EMPLOYING DISTRIBUTED ACOUSTIC REFLECTION TRANSDUCERS".

SUMMARY OF THE INVENTION

An object of the present invention is to improve the inside-passband filtering characteristic of an internal reflection type unidirectional surface acoustic wave filter using weighted electrodes.

To attain the above object, the present invention adopts the following means.

(1) A unidirectional surface acoustic wave filter comprising input and output interdigital transducers disposed on a piezoelectric substrate, the interdigital transducers being subjected to weighting of their finger electrodes and having floating electrodes, wherein the floating electrodes of each interdigital transducer are constructed in such a way as to cancel waves reflected at portions where the finger electrodes of the interdigital transducers do not electrically cross each other.

(2) A unidirectional surface acoustic wave filter comprising input and output interdigital transducers disposed on a piezoelectric substrate, the interdigital transducers being subjected to weighting of their finger electrodes by a withdrawal technique and having floating electrodes, wherein the floating electrodes of each interdigital transducer are disposed in such positions that the floating electrodes located at portions where the finger electrodes of the interdigital transducers do not electrically cross each other cancel waves reflected thereby.

(3) A unidirectional surface acoustic wave filter comprising input and output interdigital transducers disposed on a piezoelectric substrate, the interdigital transducers being subjected to weighting of their finger electrodes by an apodization technique and having floating electrodes, wherein the finger electrodes of each interdigital transducer are disposed in such a manner that portions of the finger electrodes which do not electrically cross each other in a direction perpendicular to the propagation direction of surface acoustic waves cancel the waves reflected thereby.

(4) A unidirectional surface acoustic wave filter comprising input and output interdigital transducers disposed on a piezoelectric substrate, the interdigital transducers each having finger electrodes with a width of $\lambda/12$ ($\lambda$: wavelength) and being subjected to weighting of their finger electrodes by a withdrawal technique and having short-circuit type floating electrodes, wherein the intercentral distances between the floating electrodes and the finger electrodes located at portions where the finger electrodes of each interdigital transducer do not electrically cross each other are each $(3/12) \lambda$.

(5) A unidirectional surface acoustic wave filter comprising input and output interdigital transducers disposed on a piezoelectric substrate, the interdigital transducers each having finger electrodes with a width of $\lambda/12$ and being subjected to weighting of their finger electrodes by an apodization technique and having short-circuit type floating electrodes, wherein the intercentral distances between dummy electrodes located at portions where the finger electrodes of each interdigital transducer do not electrically cross each other are each (3/12) λ.

DESCRIPTION OF THE PREFERRED EMBODIMENTS

Three embodiments of the present invention will now be sequentially explained with reference to FIGS. 5 through 9.

First, a first embodiment of the present invention will be explained with reference to FIG. 5.

Figure 5:
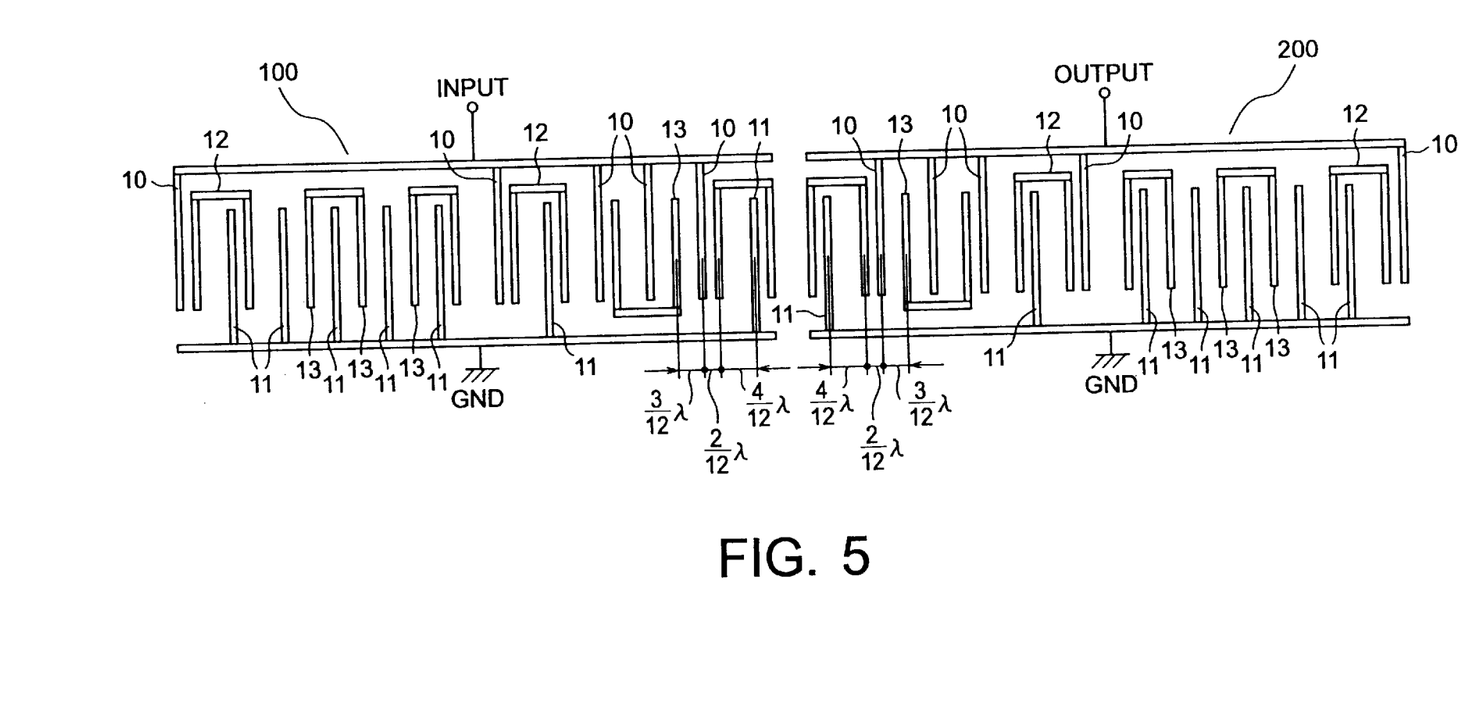
FIG. 5 is a plan view illustrating a first embodiment of the present invention.

FIG. 5 is a view illustrating a structure of the first embodiment of the present invention. An internal reflection type unidirectional surface acoustic wave filter having positive and negative finger electrodes 10 and 11 of input and output interdigital transducers 100 and 200 and having open or short-circuit type floating electrodes 12 therebetween is subjected to weighting of its electrodes by the withdrawal technique and is structured such that at portions where the positive and negative finger electrodes 10 and 11 do not electrically cross each other (a voltage does not occur), i.e., in case where adjacent finger electrodes are the same positive or negative finger electrode 10 or 11, the floating electrodes 13 located therebetween are not shifted from the center positions therebetween.

The floating electrode 12 is displaced from the center position between the positive and negative finger electrodes 10 and 11. As a result, the waves reflected in the rightward direction and those reflected in the leftward direction have their phases shifted from each other. The waves reflected in the leftward direction are made the same in phase as the waves excited by the positive and negative finger electrodes 10 and 11 while, on the other hand, the waves reflected in the rightward direction are made opposite in phase with respect thereto. By this arrangement, the floating electrode 12 causes the surface acoustic wave energy to have unidirectivity. On the other hand, the floating electrode 13 located at the portion where no electrical cross is present between the positive finger electrode 10 and the negative finger electrode 11 operates such that the waves reflected in the leftward and rightward directions are the same in phase and so does not cause the occurrence of the unidirectivity. That is, this floating electrode 13 produces equal reflected waves in the both leftward and rightward directions. However, by disposing the floating electrode 13 at an appropriate position, the internal reflection is canceled.

Next, an example of the first embodiment of the present invention will be explained with reference to FIGS. 5 and 6.

In FIG. 5, assuming that the width of the finger electrodes of the interdigital transducers is λ/12 (λ: wavelength), by displacing the short-circuit type floating electrode 12 from the center position between the positive and negative finger electrodes 10 and 11 by a distance of λ/12, the surface acoustic wave is strongly excited in an arrow-indicated direction in FIG. 5, with the result that unidirectivity occurs. On the other hand, the floating electrode 13 at the portion where no electrical cross is made between the positive and negative finger electrodes 10 and 11 is disposed in such a way that the floating electrode 13 is located at the center between the positive and negative finger electrodes 10 and 11, namely that the intercentral distance between itself and the positive or negative finger electrode 10 or 11 is (3/12) λ. By this disposition, it follows that the positive finger electrode 10, negative finger electrode 11 and floating electrode 13 are disposed at intervals of λ/4. Whereby, the reflected waves of the respective finger electrodes cancel each other and so the internal reflection is canceled.

Figure 6:
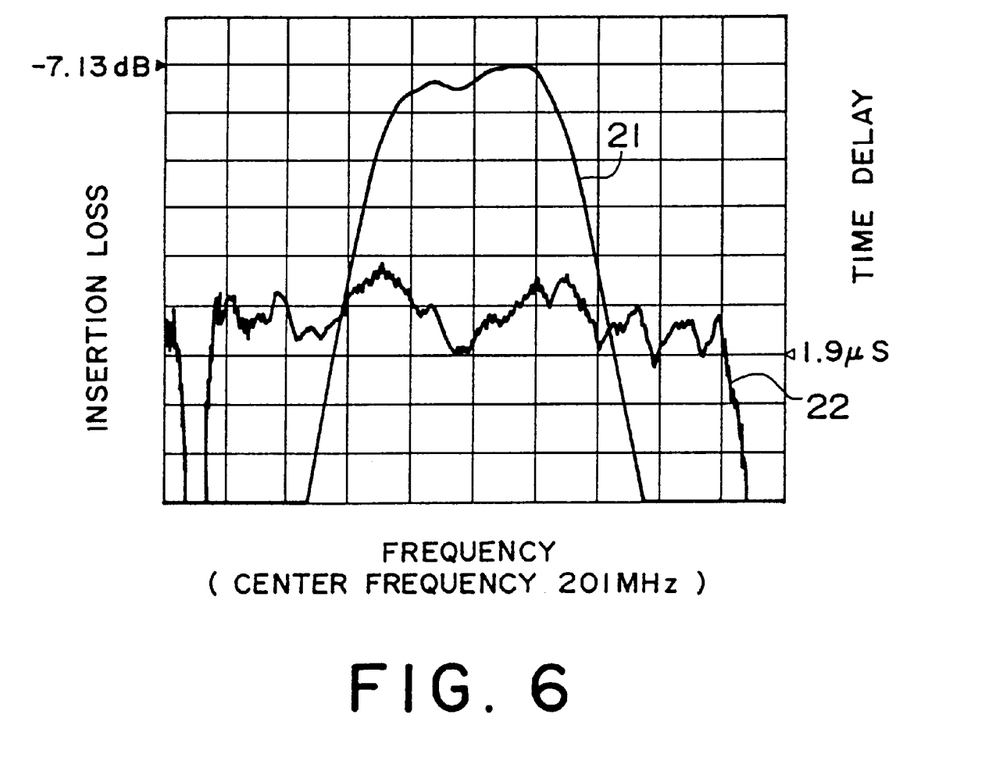
FIG. 6 is a graph illustrating an amplitude characteristic and group delay characteristic obtained by an example of the first embodiment of the present invention.

FIG. 6 illustrates an amplitude characteristic 21 and a group delay characteristic 22 obtained from a filter prepared by disposing the electrode structure of FIG. 5 with respect to each of input and output transducers on a quartz substrate. In this graphic diagram, the center frequency is 201 MHz (megahertz'), the thickness of the aluminium electrode is 200 nm (nanometers) and the impedance is 90 ohms at the input side and 150 ohms at the output side. The axis of abscissas represents the frequency and is graduated in 100 kHz (kilohertz') per graduation. The axis of ordinate represents the insertion loss of the amplitude characteristic and the time delay of the group delay characteristic and is graduated in 1 dB (decibel) and 1 μs (microsecond), respectively, per graduation.

A second embodiment of the present invention will be explained with reference to FIG. 7.

Figure 7:
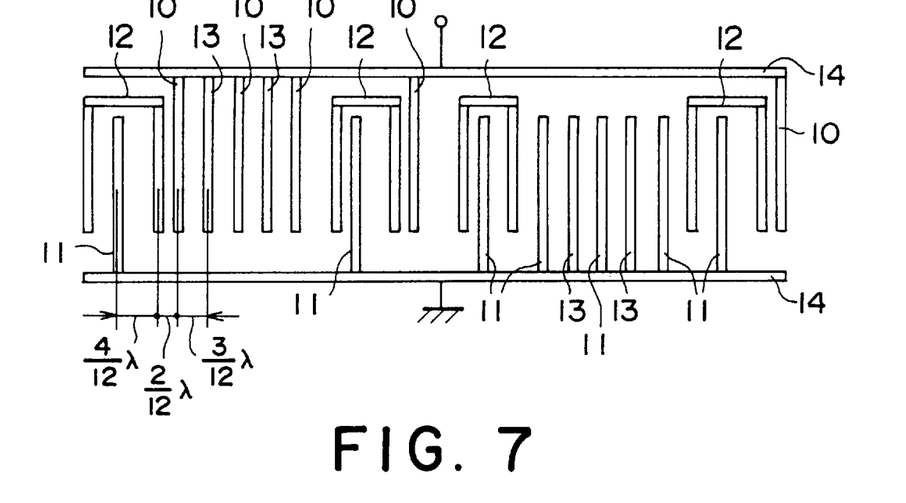
FIG. 7 is a plan view illustrating a second embodiment of the present invention.

FIG. 7 is a view illustrating a structure of the second embodiment of the present invention. As in the case of the first embodiment, the floating electrodes 13 are disposed in such positions that the internal reflection is canceled, and further, they are connected to busbars 14 and constitute single electrodes.

Next, an example of the second embodiment of the present invention will be explained with reference to FIGS. 7 and 8.

In FIG. 7, assuming that the width of the finger electrodes of the interdigital transducers is λ/12, by disposing the positive and negative finger electrodes 10 and 11 and the floating electrode 13 in such a way that the intercentral distances between the electrodes 10 or 11 and the electrode 13 are each (3/12) λ as in the case of the example of the first embodiment, the internal reflection is canceled. The floating electrodes 13 are connected to the busbars and constitute single electrodes.

Figure 8:
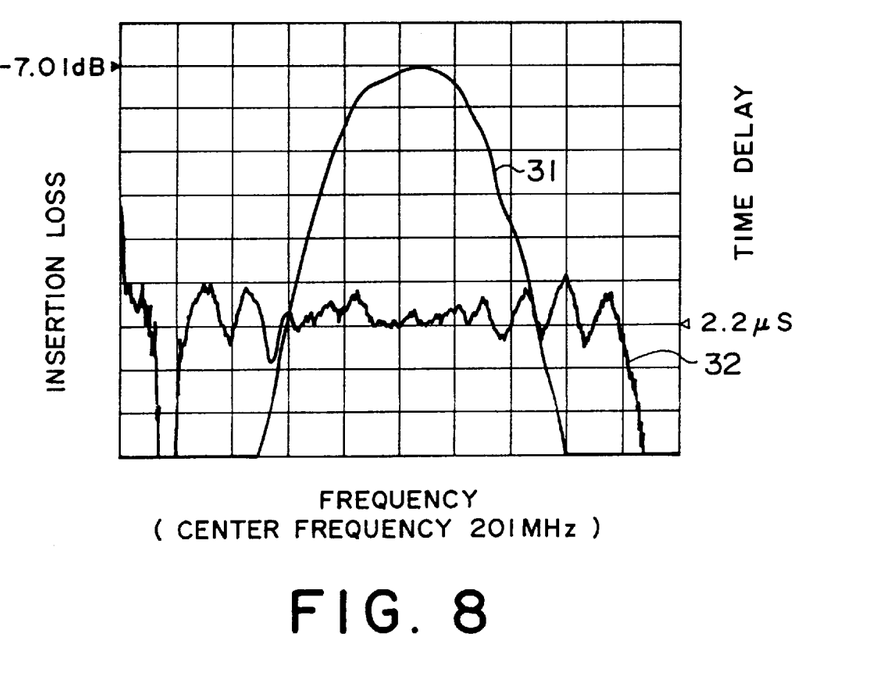
FIG. 8 is a graph illustrating an amplitude characteristic and group delay characteristic obtained by an example of the second embodiment of the present invention.

FIG. 8 illustrates an amplitude characteristic 31 and a group delay characteristic 32 obtained from a filter prepared by disposing the electrode structure of FIG. 7 with respect to each of input and output transducers on a quartz substrate. In this graphic diagram, the center frequency is 201 MHz (megahertz'), the thickness of the aluminium electrode is 200 nm (nanometers) and the impedance is 90 ohms at the input side and 150 ohms at the output side as in the case of the example of the first embodiment.

A third embodiment of the present invention will be explained with reference to FIG. 9.

Figure 9:
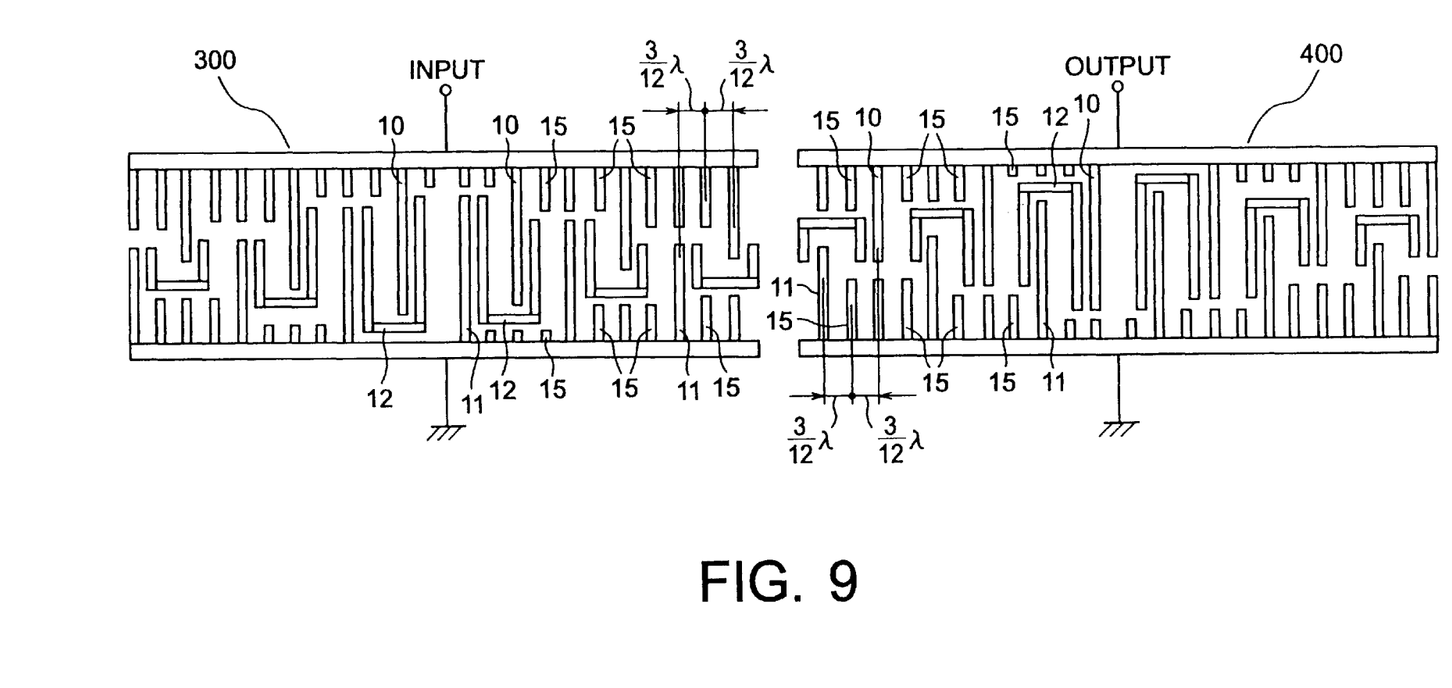
FIG. 9 is a plan view illustrating a third embodiment of the present invention.

FIG. 9 is a view illustrating a structure of the third embodiment of the present invention. An internal reflection type unidirectional surface acoustic wave filter having positive and negative finger electrodes 10 and 11 of interdigital transducers 300 and 400 and having open or short-circuit type floating electrodes therebetween is subjected to weighting of its electrodes by the apodization technique and is structured such that among dummy electrodes located at the portions where the positive and negative finger electrodes 10 and 11 do not cross each other, the dummy electrodes 15 located at the portions of the floating electrodes 12 are disposed by being displaced relatively thereto.

Conventionally, as illustrated in FIG. 2, the dummy electrodes 15 exist at a portion where the dummy electrodes 15 coincide with the floating electrode 12 in the X direction (the propagation direction of the surface acoustic waves) thereof. Therefore, at this portion, the internal reflection occurs. According to this third embodiment, the dummy electrodes 15 are disposed at the positions enabling the cancellation of this internal reflection.

Subsequently, an example of the third embodiment of the present invention will be explained with reference to FIG. 9.

In FIG. 9, assuming that the width of the finger electrodes of interdigital transducers be $\lambda/12$, by disposing the positive and negative finger electrodes 10 and 11 and the dummy electrodes 15 in such a way that the intercentral distances between the electrodes 10 or 11 and the dummy electrodes 15 are each $(3/12)\lambda$, the internal reflection will be canceled.

According to the present invention, by displacing the position of the floating electrodes located at the portion where no electrical cross is made between the positive and negative finger electrodes of the interdigital transducer, the internal reflection having no relevancy to the directivity is canceled with the result that the inside-band characteristic can be improved.

What is claimed is:

1. A unidirectional surface acoustic wave filter comprising:
   input and output interdigital transducers disposed on a substrate, said interdigital transducers each having finger electrodes with a width of $\lambda/12$ which are subjected to weighting by an apodization technique; and
   short-circuit type floating electrodes disposed on said substrate,
   wherein intercentral distances between dummy electrodes located at portions where said finger electrodes of each interdigital transducer do not electrically cross each other are each $(3/12)\lambda$.

2. The filter recited in claim 1, wherein said substrate is one of a quartz substrate and a piezoelectric substrate.

3. A unidirectional surface acoustic wave filter, comprising:
   input and output interdigital transducers disposed on a piezoelectric substrate, each of said interdigital transducers having positive and negative finger electrodes which are subjected to weighting by a withdrawal technique;
   floating electrodes disposed on said substrate; and
   a set of single electrodes disposed on said substrate,
   wherein each of said floating electrodes is displaced from a center position between a positive finger electrode and an adjacent negative finger electrode of one of said input interdigital transducer and said output interdigital transducer, and
   wherein each of said single electrodes is disposed at a center position between adjacent positive or negative finger electrodes of said input interdigital transducer or between adjacent positive or negative finger electrodes of said output interdigital transducer, thereby canceling internally reflected waves, and
   wherein said single electrodes are connected to busbars.

4. A unidirectional surface acoustic wave filter comprising:
   input and output interdigital transducers disposed on a piezoelectric substrate, each of said interdigital transducers having positive and negative finger electrodes which are weighted by an apodization technique;
   a first set of floating electrodes disposed on said substrate, each of said first set of floating electrodes being displaced from a center position between a positive finger electrode and an adjacent negative finger electrode of one of said input interdigital transducer and said output interdigital transducer; and
   a second set of floating electrodes disposed on said substrate,
   wherein said finger electrodes of each interdigital transducers are disposed in such a manner that portions of said finger electrodes do not electrically cross each other in a direction perpendicular to a propagation direction of surface acoustic waves, thereby canceling internally reflected waves.

5. A unidirectional surface acoustic wave filter comprising:
   input and output interdigital transducers disposed on a piezoelectric substrate, said interdigital transducers each having positive and negative finger electrodes with a width of $\lambda/12$ and being subjected to weighting of their finger electrodes by a withdrawal technique;
   a first set of floating electrodes disposed on said substrate; and
   a second set of short-circuit type floating electrodes disposed on said substrate,
   wherein each of said first set of floating electrodes is displaced from a center position between a positive finger electrode and an adjacent negative finger electrode of one of said input interdigital transducer and said output interdigital transducer, and
   wherein intercentral distances between said short-circuit type floating electrodes and said finger electrodes located at portions wherein said finger electrodes of each interdigital transducer do not electrically cross each other are each $(3/12)\lambda$.

6. A unidirectional surface acoustic wave filter comprising:
   input and output interdigital transducers disposed on a piezoelectric substrate, said interdigital transducers each having positive and negative finger electrodes with a width of $\lambda/12$ and being subjected to weighting of their finger electrodes by a withdrawal technique;
   floating electrodes disposed on said substrate; and
   a set of single electrodes disposed on said substrate,
   wherein each of said floating electrodes is displaced from a center position between a positive finger electrode and an adjacent negative finger electrode of one of said input interdigital transducer and said output interdigital transducer, and wherein intercentral distances between said single electrodes and i finger electrodes located at portions wherein said finger electrodes of each interdigital transducer do not electrically cross each other are each $(3/12)\lambda$, and wherein said single electrodes located at portions where said finger electrodes of said interdigital transducers do not electrically cross each other are connected to busbars.

7. A unidirectional surface acoustic wave filter comprising:

input and output interdigital transducers disposed on a substrate, each of said interdigital transducers having positive and negative finger electrodes which are subjected to weighting;

a first set of floating electrodes disposed on said substrate; and a second set of floating electrodes disposed on said substrate, wherein each of said first set of floating electrodes is displaced from a center position between a positive finger electrode and an adjacent negative finger electrode of one of said input interdigital transducer and said output interdigital transducer, and wherein each of said second set of floating electrodes is constructed at a center position between adjacent positive or negative finger electrodes of said input interdigital transducer or between adjacent positive or negative finger electrodes of said output interdigital transducer, thereby canceling waves reflected at portions where said finger electrodes of said interdigital transducers do not electrically cross each other.

8. The filter recited in claim 7, wherein said adjacent finger electrodes have a same width and wherein a distance said center position is away from each of said adjacent finger electrodes is three times the width of said adjacent finger electrodes.

9. The filter recited in claim 7, wherein said adjacent finger electrodes each have a width of $\lambda/12$ and wherein the distance of said center position is $\lambda/4$.

10. The filter recited in claim 7, wherein said second set of floating electrodes are one of open- or short-circuit type floating electrodes.

11. The filter recited in claim 7, wherein said substrate is one of a quartz substrate and a piezoelectric substrate.

12. A unidirectional surface acoustic wave filter comprising:

input and output interdigital transducers disposed on a piezoelectric substrate, each of said interdigital transducers having positive and negative finger electrodes which are subjected to weighting by a withdrawal technique;

a first set of floating electrodes disposed on said substrate; and a second set of floating electrodes disposed on said substrate, wherein each of said first set of floating electrodes is displaced from a center position between a positive finger electrode and an adjacent negative finger electrode of one of said input interdigital transducer and said output interdigital transducer, and wherein each of said second set of floating electrodes is disposed at a center position between adjacent positive or negative finger electrodes of said input interdigital transducer or between adjacent positive or negative finger electrodes of said output interdigital transducer, thereby canceling internally reflected waves.

* * * * *